(12) United States Patent
Zhang et al.

(10) Patent No.: US 6,870,415 B2
(45) Date of Patent: Mar. 22, 2005

(54) DELAY GENERATOR WITH CONTROLLED DELAY CIRCUIT

(75) Inventors: Bo Zhang, Las Flores, CA (US); Guangming Yin, Foothill Range, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/243,086

(22) Filed: Sep. 12, 2002

(65) Prior Publication Data

US 2004/0051576 A1 Mar. 18, 2004

(51) Int. Cl.[7] .............................................. H03H 11/26
(52) U.S. Cl. ...................... 327/274; 327/287; 327/156
(58) Field of Search ........................ 327/261, 269–271, 327/274–278, 284, 295, 298, 156–158, 161, 287; 375/373–376; 331/1 A

(56) References Cited

U.S. PATENT DOCUMENTS

| | | | | |
|---|---|---|---|---|
| 5,146,121 A | * | 9/1992 | Searles et al. ............... | 327/276 |
| 5,712,884 A | * | 1/1998 | Jeong ......................... | 375/375 |
| 5,740,410 A | * | 4/1998 | McDermott .................. | 713/501 |
| 5,854,797 A | * | 12/1998 | Schwartz et al. ........... | 714/724 |
| 6,100,735 A | * | 8/2000 | Lu .............................. | 327/158 |
| 6,157,231 A | * | 12/2000 | Wasson ....................... | 327/156 |
| 6,580,304 B1 | * | 6/2003 | Rieven ........................ | 327/276 |
| 6,642,761 B1 | * | 11/2003 | Tien ............................ | 327/158 |

* cited by examiner

Primary Examiner—Minh Nguyen
(74) Attorney, Agent, or Firm—Christie, Parker & Hale, LLP

(57) ABSTRACT

A delay circuit generates delayed signals. The delay circuit includes a delay locked loop having an input terminal coupled to a periodic input signal, the delay locked loop generating one or more delayed periodic signals and a control signal for controlling the time delay between the periodic input signal and the delayed periodic signals. The delay circuit also includes a controlled delay circuit for generating one or more delayed periodic signals. The controlled delay circuit has an input terminal for receiving at least one of the delayed periodic signals from the delay locked loop and a delay control terminal coupled to the control signal from the delay locked loop for controlling the time delay between the delayed periodic input signal received from the delay locked loop and the one or more delayed periodic signals generated by the controlled delay circuit.

29 Claims, 9 Drawing Sheets

DELAY GENERATOR WITH CONTROLLED DELAY CIRCUIT

BACKGROUND

The present invention relates in general to electronic circuits and in particular to an electronic circuit for generating delays using a delay locked loop.

The growth and maturity of the electronics industry has led to a variety of products that have changed the way people live and work. Electronic circuits are currently the dominant technology for creating products that move and shape information. In the world of electronics, information is typically represented by zeros and ones. Electronic representations of zeros and ones are referred to as digital signals. Electronic circuits process digital signals to perform a wide variety of functions.

However, as the electronics industry continues to grow, there is an ever increasing demand on the amount of information that must be processed by electronic circuits. Accordingly, the speed at which these electronic circuits operate has continually increased. An electronic circuit's processing speed is determined by the frequency of the signals. For example, some electronic circuits carry out a processing operation on each rising edge of a system clock. These circuits are referred to as "synchronous" circuits. Therefore, the processing speed of the circuit will be determined by the frequency of the clock.

As the operating frequencies of electronic circuits continue to increase, the timing relationships between signals can severely limit the performance of the system. For example, if a clock signal triggers the execution of a function requiring two digital input signals, the function will produce an erroneous result if the clock signal triggers the function before one or both of the digital inputs are available. One circuit commonly used to control the timing relationships between signals is a delay circuit. A delay circuit receives a digital signal on an input terminal and produces the signal on an output terminal after a predetermined period of time (i.e., after a time delay). Delay circuits may be used to delay signals for a variety of reasons depending on the particular application. However, as operating frequencies increase, delay circuits must provide ever increasing levels of precision to ensure accurate timing of the signals. Accordingly, there is a need for improved delay circuits that can provide precision delays.

SUMMARY

Embodiments of the present invention provide a delay circuit that may be used to generate delayed signals. Delayed signals may be used to control the timing of signals on an integrated circuit, for example. In one embodiment, a delay circuit comprises a delay locked loop having a input terminal coupled to a periodic input signal, the delay locked loop generating one or more delayed periodic signals and a control signal for controlling the time delay between the periodic input signal and the delayed periodic signals. The delay circuit also includes a controlled delay circuit for generating one or more delayed periodic signals. The controlled delay circuit has an input terminal for receiving at least one of the delayed periodic signals from the delay locked loop and a delay control terminal coupled to the control signal from the delay locked loop for controlling the time delay between the delayed periodic input signal received at the input terminal and the one or more delayed periodic signals generated by the controlled delay circuit.

In one embodiment, the present invention further comprises a multiplexer for selectively coupling one of the delayed periodic signals to a multiplexer output terminal in response to a multiplexer selection control signal.

In one embodiment, one or both of the controlled delay circuits comprises a plurality of series connected controlled delay elements each including a control terminal coupled to the control signal for controlling the time delay of each delay element.

In one embodiment, the control signal is a bias control signal, and the delay locked loop includes a bias generator.

In one embodiment, the delay locked loop includes an XOR logic circuit.

In one embodiment, the delay circuit receives a clock signal and generates delayed clock signals.

The following detailed description and accompanying drawings provide a better understanding of the nature and advantages of the present invention.

DETAILED DESCRIPTION

Figure 1:
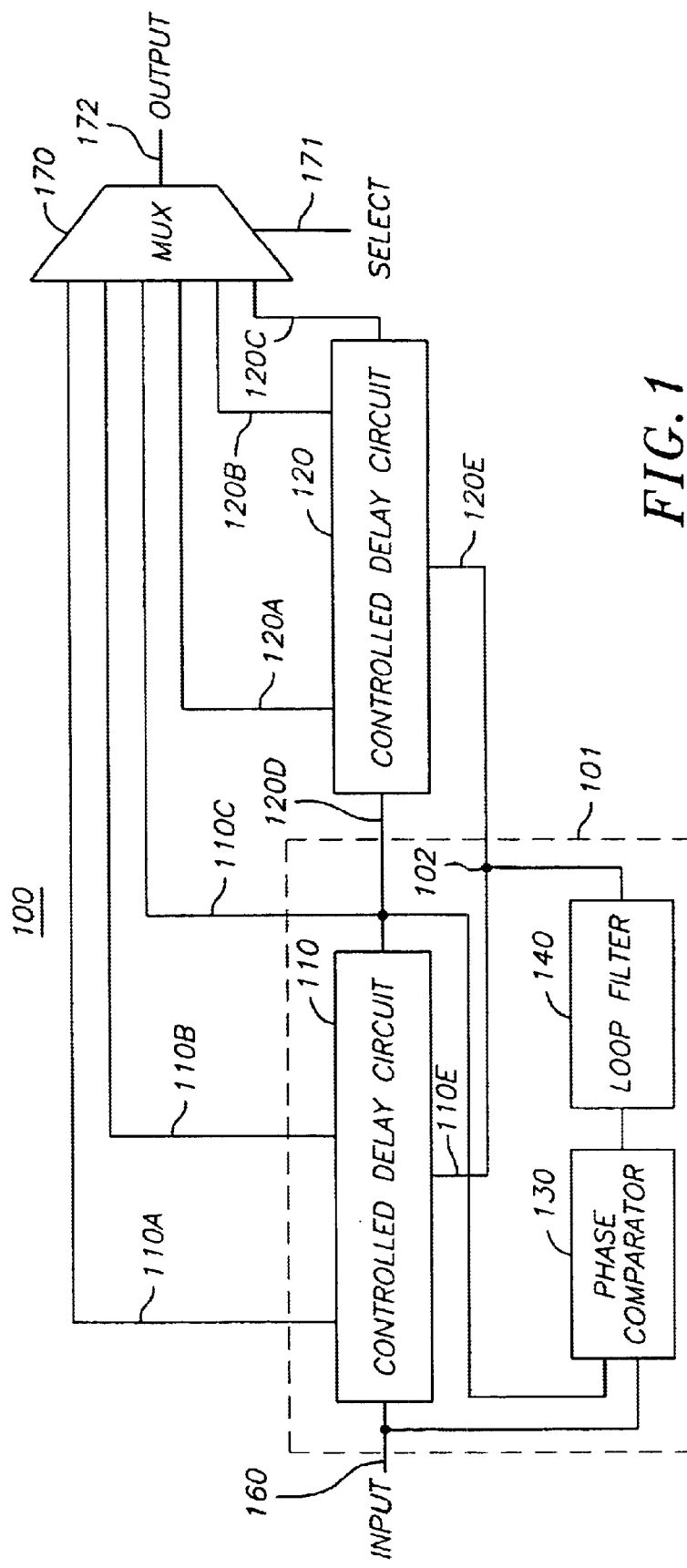
FIG. 1 illustrates a delay circuit according to one embodiment of the present invention.

FIG. 1 illustrates a delay circuit 100 according to one embodiment of the present invention. Delay circuit 100 may be used to generate delayed signals useful for a variety of application in an electronic system or integrated circuit. Delay circuit 100 includes a delay locked loop 101 and controlled delay circuit 120. Delay locked loop 101 includes an input terminal 160 for receiving a periodic input signal. Delay locked loop 101 includes circuitry for generating a delayed periodic signal, or signals, such as delayed signals on output terminals 110A–110C for example. Delayed signals are also sometimes referred to as skewed signals. Delay locked loop 101 also generates a control signal 102 for controlling the time delay between the periodic input signal received at input terminal 160 and the delayed periodic signal or signals.

Delay circuit 100 also includes a controlled delay circuit 120. Controlled delay circuit 120 generates an additional delayed periodic signal, or signals, such as delayed signals on output terminals 120A–120C for example. Controlled delay circuit 120 includes an input terminal 120D for receiving a delayed signal from delay locked loop 101.

Controlled delay circuit 120 also receives control signal 102 on delay control terminal 120E for controlling the time delay between the delayed periodic input signal received at input terminal 120D and delayed signals on output terminals 120A–120C.

The delayed signals from delay locked loop 101 and controlled delay circuit 120 can be used for a variety of useful purposes in an electronic system or integrated circuit. In one embodiment, the present invention may optionally further include a multiplexer 170 ("MUX") having input terminals coupled to output terminals 110A–C and 120A–C. Multiplexer 170 includes a select input 171, which may be one signal or multiple signals, for receiving a selection control signal. In response to the selection control signal, the multiplexer selectively couples one of the delayed signals from delay locked loop 101 or controlled delay circuit 120 to multiplexer output terminal 172.

While many known delay locked loop architectures could be used for delay locked loop 101, in one particularly useful embodiment the delay locked loop circuitry for generating a delayed periodic signal, or signals, includes a second controlled delay circuit 110, a phase comparator 130, and a loop filter 140. Controlled delay circuit 110 includes an input terminal for receiving a periodic input signal, and further includes one or more output terminals 110A–C that carry delayed versions of the periodic input signal. Controlled delay circuit 110 also receives control signal 102 on delay control terminal 110E for controlling the time delay between the delayed periodic input signal received at input terminal 160 and delayed signals on output terminals 110A–110C.

Control signal 102, which is used to establish the time delays introduced by controlled delay circuits 110 and 120, is generated by the action of phase comparator 130 and loop filter 140. Phase comparator 130 includes one input coupled to input terminal 160 for receiving the periodic input signal, and further includes a second input coupled to the output terminal 110C for receiving a delayed periodic signal from controlled delay circuit 110. Phase comparator 130 generates a signal indicating the phase relationship between the two input signals. Exemplary circuits useful as phase comparators are phase detectors or phase frequency detectors, both of which are well known to those skilled in the art. Some embodiments of the phase comparator may also include a charge pump, which is also well known to those skilled in the art.

The output of phase comparator 130 is coupled to a loop filter 140. Loop filter 140 receives the output of phase comparator 130 and generates control signal 102. Different embodiments of the invention may use an analog or digital filter. Control signal 102, in turn, is coupled to each controlled delay circuit for controlling the time delay between the periodic input signal received at input terminal 160 and the delayed periodic signal or signals. Control signal 102 will cause the delayed signal generated by controlled delay circuit 110 to be in a predetermined phase relationship with the periodic input signal on terminal 160 because the phase comparator will receive both of these signals and continuously adjust the delay of controlled delay circuit 110 until the predetermined phase relationship is reached. In one embodiment, the phase comparator will cause the loop filter to adjust the delay of controlled delay circuit 110 until the periodic input signal is "in phase" with the delayed periodic signal on terminal 110C (i.e., the predetermined phase relationship is when the signals are "in phase"). However, those skilled in the art will understand that other embodiments may use other predetermined phase relationships (e.g., the signals may be out of phase by a fixed amount).

Figure 2:
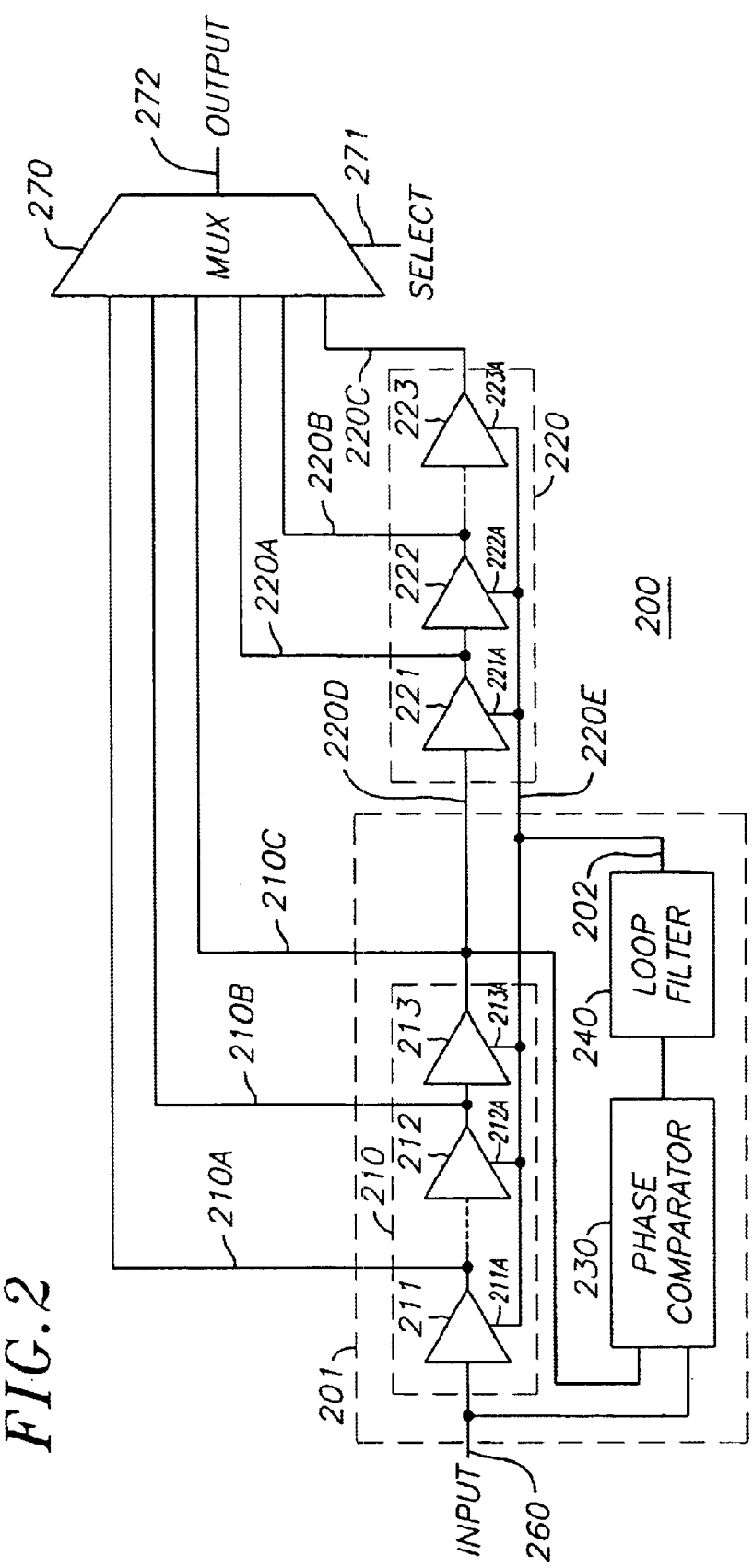
FIG. 2 illustrates a delay circuit according to another embodiment of the present invention.

FIG. 2 illustrates a delay circuit 200 according to another embodiment of the present invention. Delay circuit 200 includes a delay locked loop 201 coupled to a controlled delay circuit 220. Delay locked loop 201 includes a controlled delay circuit 210, a phase detector 230, and a filter 240. FIG. 2 illustrates controlled delay circuits according to one advantageous embodiment of the present invention. Controlled delay circuits 210 and 220 comprise series connected controlled delay elements that each receive a signal and produce a delayed signal. The delay introduced by each delay element is determined by control signal 202 received on delay control terminals 211A, 212A, and 213A.

Delay circuit 200 shows three delay elements 211–313 having output terminals 210A, 210B, and 210C. However, it is to be understood that fewer or more delay elements could be used. The first delay element 211 is coupled to a delay circuit input terminal 260. Delay circuit input terminal 260 may be coupled to a pin of the integrated circuit to receive a clock signal from an external source, for example, or to another circuit residing on the same integrated circuit. An output of delay element 211 is connected in series with delay elements 212 and 213. The output of delay element 213 is coupled to the input of phase comparator 230. The other input to phase comparator 230 is coupled to input terminal 260. The output of phase comparator 230 is coupled in series with filter 240. The delay locked loop will operate to adjust the delay of delay circuit 210 so that the periodic input signal received on input terminal 260 is in a predetermined phase relationship with the delayed periodic signal on terminal 210C.

Each of the delay elements 211–213 includes a delay control terminal 211A–213A for controlling the time delay of each delay element. Accordingly, the time delay of a delay element may be a function of control signal 202 received on the delay element's delay control terminal. Therefore, phase comparator 230 compares the input signal of delay locked loop 201 to the delayed signal at the output of series connected delay elements 210, and adjusts the total time delay of the series connected delay elements 211–213 so that the phase of the delayed signal on output terminal 210A is in a predetermined phase relationship (e.g., in phase) with the phase of the input signal. In one embodiment, each delay element may be optionally designed to produce approximately the same time delay as each of the other delay elements in response to receiving control signal 202. The delay control terminals of each delay element 211–213 may receive the control signals and configure the delay elements to have time delays that are approximately the same.

Control signal 202 is also used to control a second controlled delay circuit coupled to the output of delay locked loop 201. Accordingly, second controlled delay circuit 220 is coupled to receive delayed signals from delay locked loop 201, and a delay control terminal 220E of controlled delay circuit 220 is coupled to control signal 202 from delay locked loop 201. Controlled delay circuit 220 may include one or more delay elements. FIG. 2 shows three delay elements 221–223, but fewer or more delay elements could also be used. Delay element 221 is coupled to the output of delay locked loop 201. An output of delay element 221 is connected in series with delay elements 222 and 223. Each of the delay elements 221–223 also includes individual delay control terminals 221A–223A for controlling the time delay of each delay element. The time delay of a delay element is a function of the control signal 202 received on the delay element's delay control terminal.

In one embodiment, all of the delay elements 211–213 and 221–223 are optionally designed to produce approximately the same time delay as each of the other delay elements in response to control signal 202. Some or all of the output terminals of the delay elements (i.e., output taps) may also be coupled to a multiplexer ("MUX") 270. Therefore, the output signal at terminal 272 can be selected to be incrementally out of phase with the input signal. For example, the outputs of delay elements 211–213 and 221–223 are coupled to multiplexer 270. A select input 271 to multiplexer 270 allows the multiplexer output 272 to be selectively coupled to any one of the delay outputs. Select input 271 may be coupled to a pin of the integrated circuit to receive a select signal from an external source, for example, or may be coupled to decoder circuitry (not shown) that receives control signals from either an external or internal source. Accordingly, output 272 can be programmed to have any one of a number of different phase relationships with the input signal. This technique is particularly advantageous if a clock signal is provided to input 260. If the input signal is a clock signal, the delay or skew of the output signal can be accurately controlled by selectively coupling different output taps to output terminal 272.

Figure 3:
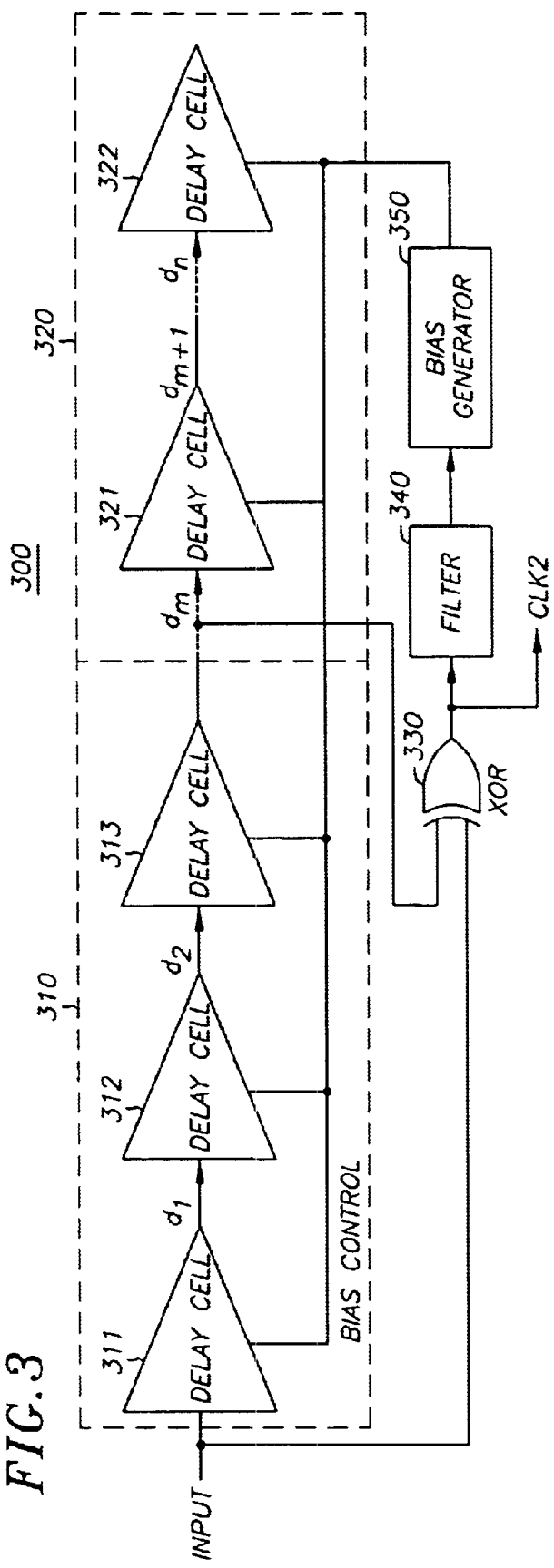
FIG. 3 illustrates a delay circuit according to another embodiment of the present invention.

FIG. 3 illustrates a delay circuit 300 according to another embodiment of the present invention. Delay circuit 300 includes a delay locked loop 310 having a delayed output and control signal output coupled to a controlled delay circuit 320. Delay locked loop 310 comprises a first controlled delay circuit 310 including delay elements 311–313, phase detector 330, and filter 340. A second controlled delay circuit 320 including delay elements 321 and 322 is coupled to an output of delay locked loop 310. It is to be understood that different numbers of delay elements may be used in either controlled delay circuit 310 or 320. According to one embodiment of the present invention, delay locked loop includes a bias generator 350, and each delay element has a delay control terminal coupled to the output of bias generator 350. The time delay introduced by each of delay elements 311–313 and 321–322 is determined by a bias voltage control signal received from bias generator 350. The bias voltage control signal may, in turn, generate a current in each delay element that can be used to control the time delay introduced by each delay element, for example.

Controlled delay circuit 310 may include M delay elements, and controlled delay circuit 320 may include (N+1)-M delay elements, where M and N are integers. Together, controlled delay circuit 310 and 320 may generate up to N+1 delayed signals (e.g., delayed clock signals). Consequently, if the delay elements are designed to be the same (e.g., the same circuit structure with approximately the same device sizes), each of the delayed signals on the N+1 outputs ("$d_{n+1}$") may be spread out across approximately equal time intervals between the input signal and the $(N+1)^{st}$ output signal.

In one embodiment of the present invention, the phase detector may be an exclusive OR ("XOR") logic circuit 330. XOR logic circuit 330 has a first input coupled to the input of controlled delay circuit 310 and a second input coupled to the output of controlled delay circuit 310. FIG. 3 shows a timing diagram for delay circuit 300 including an XOR logic circuit and a clock input. The clock input will be delayed by each of the M delay elements in controlled delay circuit 310. For the example shown in FIG. 3, the delay elements are designed to introduce approximately the same time delay in response to a bias output signal. When the clock input signal goes high (i.e., logic '1') at the input of the XOR logic circuit, the other XOR input will remain low (i.e., logic '0') until the arrival of the delayed clock signal at Mth delay element output ("$d_m$"). Thus, the output of the XOR will be high for a time period equal to the total time delay of controlled delay circuit 310. When the Mth delay element output goes high, the XOR output will again go low because both inputs are now the same (i.e., high). The XOR output will again go high when the clock signal goes low, and the XOR output will remain high for a time period equal to the total time delay of controlled delay circuit 310.

When an XOR logic circuit is coupled to a low pass filter, the loop will be balanced when the delayed signal is 90 degrees out of phase with the input signal. When this condition is met, the XOR circuit will produce a 50% duty cycle, and the output of the filter will remain constant (i.e., the average voltage at the input is constant). Initially, the total time delay of controlled delay circuit 310 will either be too large or too small for the loop to be balanced, and the input signal and Mth output signal will not result in a 50% duty cycle at the XOR output ("CLK2"). However, when the XOR output is received by a low pass filter, the filter will generate a signal indicating the phase difference between the XOR inputs, which is typically a voltage. The output of filter 340 is provided to bias generator 350, which produces the bias output that controls the time delay of each delay element. If the time delay of controlled delay circuit 310 is too large, and the XOR output is high for a longer period of time than it is low, then the bias generator produces a bias output to decrease the delay of each delay element in controlled delay circuit 310. On the other hand, if the time delay of controlled delay circuit 310 is too small, and the XOR output is low for a longer period of time than it is high, then the bias generator produces a bias output to increase the delay of each delay element in controlled delay circuit 310. However, when the loop is balanced there will be a 50% duty cycle at the output of XOR 330 with a period equal to one-half the period of the input clock period (i.e., $T_{CLK2}=T_{CLK}/2$). Some embodiments may use the increased frequency available at the output of the phase detector to control timing of other circuits in a system. Furthermore, the pulse width of the XOR output is equal to one-fourth the period of the input clock, which is the total time delay of delay unit 310 when the loop is balanced (i.e., $t_{delay}=T_{CLK}/4$). Therefore, when the loop is balanced, the time delay of each of the M delay elements will be:

$$t_{cell}=T_{CLK}/4M$$

Figure 4:
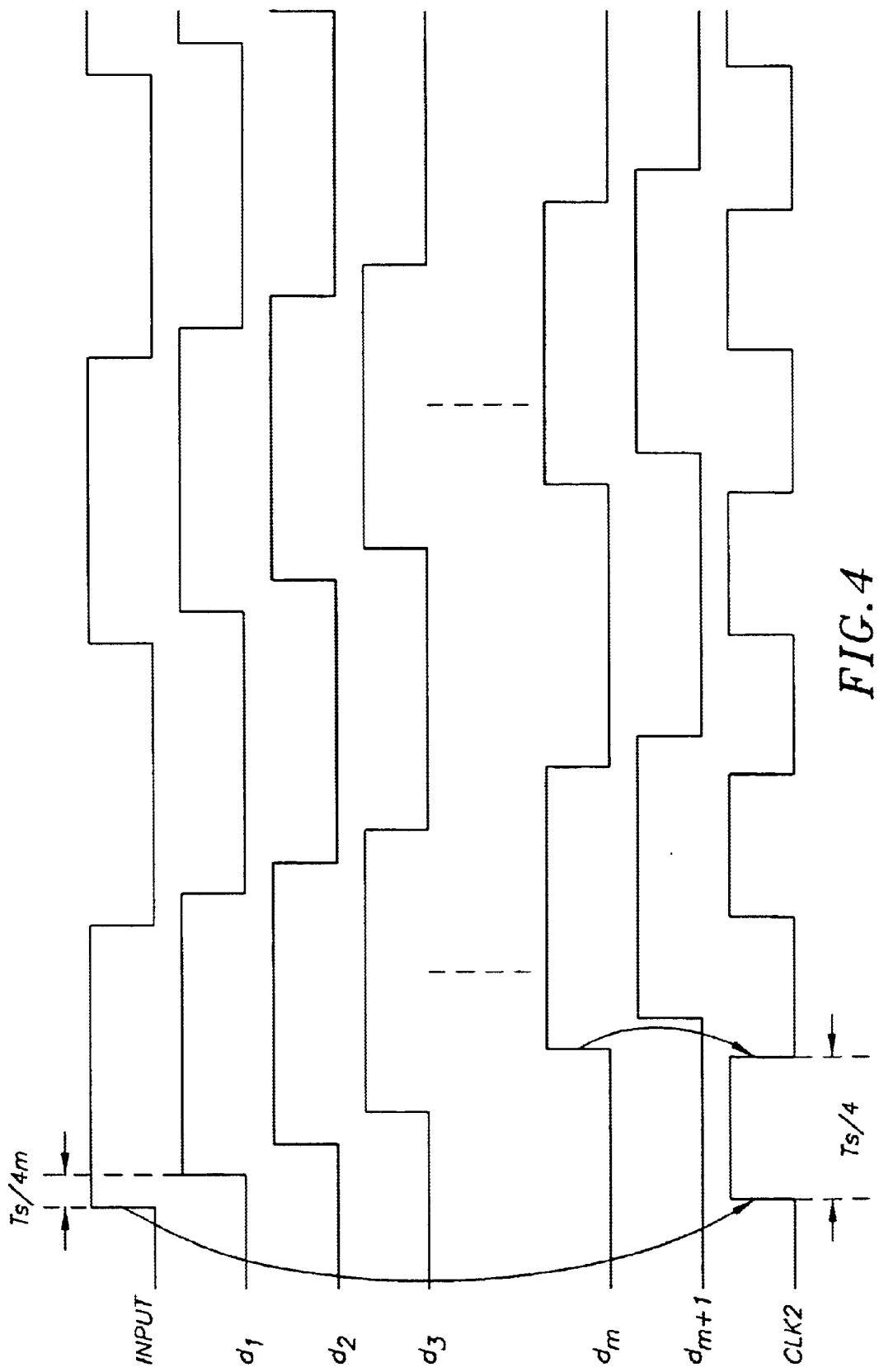
FIG. 4 shows a timing diagram for a delay circuit including an XOR logic circuit.

FIG. 4 illustrates the signals generated in the delay locked loop of FIG. 3.

Embodiments of the present invention advantageously use the control signal from the delay locked loop to control additional delay elements coupled to the output of the delay locked loop. For example, the bias output from the bias generator of the balanced delay locked loop is also coupled to control the time delay of (N+1)-M delay elements in controlled delay circuit 320. In one embodiment, each of these delay elements are designed to introduce approximately the same time delay as the individual delay elements in controlled delay circuit 310 (e.g., $t_{cell}=T_{CLK}/4M$) in response to the bias output signal from bias generator 350.

Features and advantages of the present invention have particular significance in applications that required high frequency operation. While a variety of circuit implementations may be used to practice different embodiments of the invention, for high speed applications, the circuit blocks described above may be advantageously implemented using current-controlled complementary metal-oxide-semiconductor field-effect transistor (i.e., $C^3MOS^{TM}$) logic, some of which is described in more detail in commonly owned U.S. application Ser. No. 09/484,856 entitled "CURRENT-CONTROLLED CMOS LOGIC FAMILY" filed Jan. 18, 2000 by Armond Hairapetian, which is hereby incorporated herein by reference in its entirety.

Figure 5:
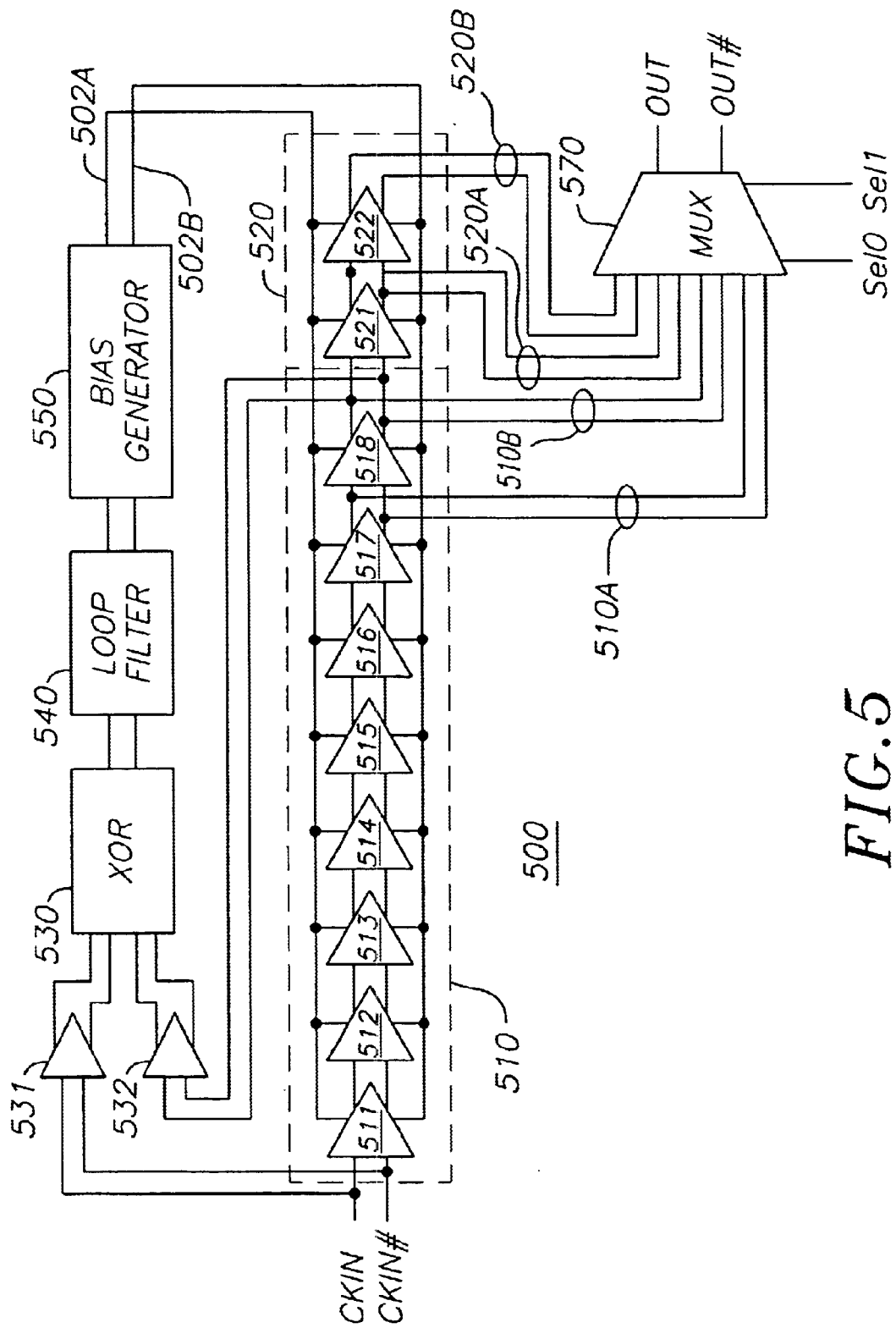
FIG. 5 illustrates a delay circuit according to another embodiment of the present invention.

FIG. 5 illustrates a delay circuit 500 according to another embodiment of the present invention. Delay circuit 500 uses differential circuits, some of which are implemented using C³MOS™ logic discussed above. Delay circuit 500 includes a delay locked loop having differential control signal outputs 502A and 502B coupled to a controlled delay circuit 520. The delay locked loop comprises a second controlled delay circuit 510, XOR logic circuit 530, loop filter 540, and bias generator 550. For high frequency operation, buffers 531 and 532 may also be used. Controlled delay circuit 510 includes series connected bias controlled delay elements 511–518. The output of controlled delay circuit 510 is connected to the input of controlled delay element 520, which comprises series connected bias controlled delay elements 521–522. Some or all of the delay elements in controlled delay circuit 510 and controlled delay circuit 520 may also include MOS transistors connected as capacitors for loading each delay element to balance the delay. The differential outputs 510A, 510B, 520A, and 520B of delay elements 517, 518, 521, and 522 are also connected to the input terminals of multiplexer 570. Multiplexer 570 receives selection control signals on select inputs SEL0 and SEL1 for selectively coupling one of the delay element outputs to multiplexer differential output terminals OUT and OUT#.

In one embodiment delay circuit 500 receives a differential clock signal CKIN and CKIN#. Delay circuit 500 may be used to generate a precision delayed clock signal. The XOR circuit receives the buffered clock signal at one input and a delayed clock signal at the other input. The action of XOR logic circuit 530, filter 540, and bias generator 550 will adjust the delay of each delay element in controlled delay circuit 510 until the delayed clock signal at the output of controlled delay circuit 510 is 90 degrees out of phase from the input clock. The same control signals 502A and 502B used to set the delay of controlled delay circuit 510 are also used to set the delay of the delay elements 521 and 522 in controlled delay circuit 520. Consequently, output terminals 510A, 510B, 520A, and 520B will carry incrementally delayed clock signals, wherein the incremental difference between delays is determined by the period of the input clock and the number of delay elements in controlled delay circuit 510. One of these delayed clocks may then be selectively coupled to the output of multiplexer 570.

Figure 6A:
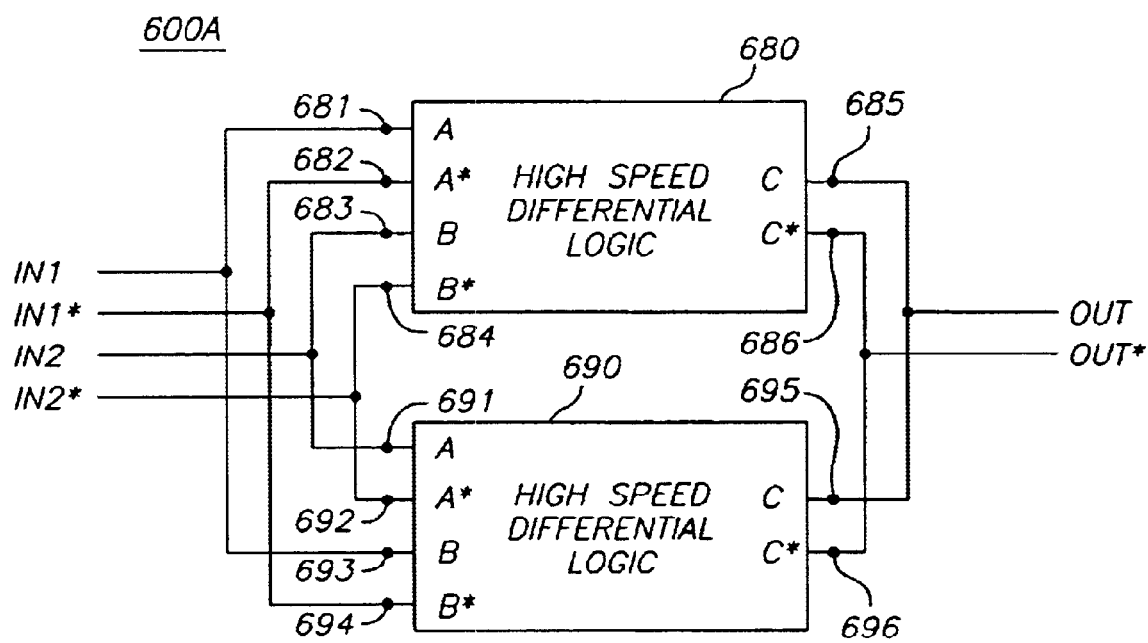
FIG. 6A illustrates an improved logic circuit according to another aspect of the present invention.

FIG. 6A illustrates an improved logic circuit 600A according to another embodiment of the present invention. Logic circuit techniques according to embodiments of the present invention are also described in commonly-owned concurrently filed U.S. patent application Ser. No. 10/243, 281, filed concurrently herewith, entitled "SYMMETRIC DIFFERENTIAL LOGIC CIRCUITS," listing Bo Zhang as inventor, the disclosure of which is hereby incorporated herein by reference in its entirety. Logic circuit 600A includes two differential logic units 680 and 690. Each logic unit 680 and 690 performs the same logical operation on the inputs using the same circuit architecture. Logic operations may include AND, NAND, OR, NOR, or XOR, for example. However, logic circuits typically receive and process different inputs using different devices (i.e., transistors). The particular configuration of devices defines the logical operation of the logic unit. One problem is that different inputs will have different signal paths to the output. Accordingly, different input transitions that produce same logical output transition may result in different output transition characteristics (e.g., different rise and fall times). At high frequencies, different output transition characteristics can severely limit system performance.

To solve this problem, logic circuit 600A utilizes two logic units with the inputs switched. Logic unit 680 receives first differential logic input signals {IN1, IN1*} on a first pair of differential input terminals 681 and 682 ("A" and "A*"). Logic unit 680 also receives second differential logic input signals {IN2, IN2*} on a second pair of differential input terminals 683 and 684 ("B" and "B*"). On the other hand, logic unit 690 receives the second differential logic inputs signals {IN2, IN2*} on a third pair of differential input terminals 691 and 692 ("A" and "A*"). Similarly, logic unit 690 receives the first differential logic inputs signals {IN1, IN1*} on a fourth pair of differential input terminals 693 and 694 ("B" and "B*"). Because each logic unit performs exactly the same logical operation, switching the inputs will produce the same logical result. Therefore, the differential output terminals 685 and 686 of logic unit 680 may be coupled to the differential output terminals 695 and 696 of logic unit 690. Switching the inputs results in each input being processed in parallel by each logic unit along symmetric signal paths. As a result, the output transition characteristics on coupled terminals 685/695 and 686/696 are uniform across all possible input transitions.

Figure 6B:
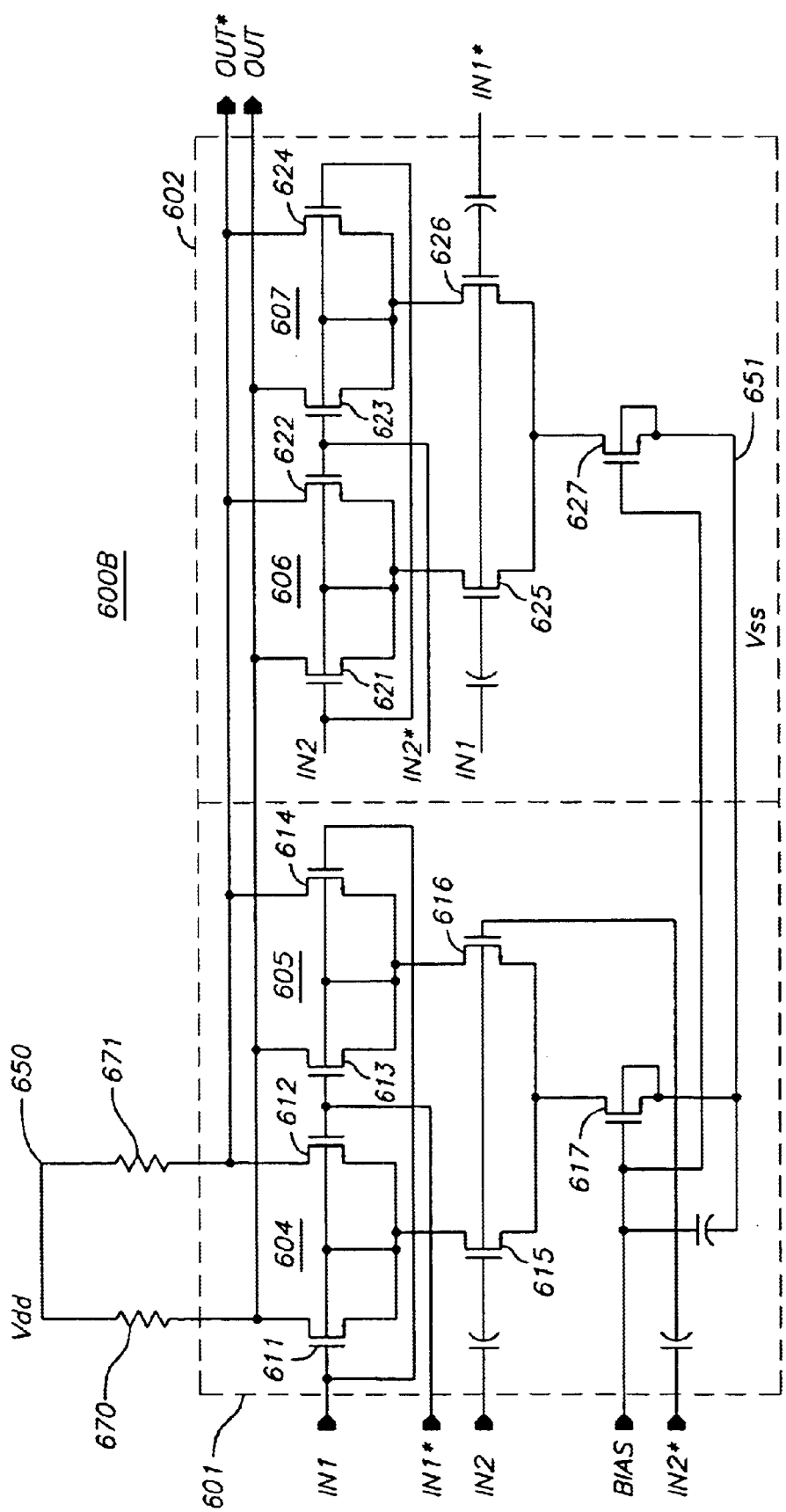
FIG. 6B illustrates an XOR logic circuit according to one embodiment of the present invention.

FIG. 6B illustrates an XOR logic circuit 600B according to one embodiment of the present invention. XOR logic circuit 600B is implemented using a combination of the technique illustrated in FIG. 6A with a C³MOS™ circuit mentioned above. The input signals to the XOR circuit are differential input pairs {IN1, IN1*} and {IN2, IN2*} and a bias input for controlling the current in the circuit. The XOR circuit receives the inputs in two XOR units 601 and 602. Each XOR unit includes two differential input pairs (e.g., 604–605 and 606–607), two current control input transistors (e.g., NMOS transistors 615–616 and 625–626), and a bias current transistor (e.g., NMOS transistors 617 and 627). XOR circuit 601 receives inputs {IN1, IN1*} at the gates of differential input transistors 611–614. Inputs {IN2, IN2*} are coupled to the gates of current control transistors 615 and 616. The bias current in XOR circuit 601 is controlled by a voltage on the "BIAS" terminal connected to the gate of bias current transistor 617. XOR circuit 602 receives inputs {IN2, IN2*} at the gates of differential input transistors 621–624. Inputs {IN1, IN1*} are coupled to the gates of current control transistors 625 and 626. The bias current in XOR circuit 602 is also controlled by a voltage on the "BIAS" terminal connected to the gate of bias current transistor 627. The drains of transistors 611, 613, 621, and 621 are connected to resistor 670 to generate first output OUT. Similarly, the drains of transistors 612, 614, 622, and 624 are connected to resistor 671 to generate second output OUT*. Resistors 670 and 671 are also connected to supply terminal 650 ("Vdd") and pull the output terminals OUT and OUT* to the supply voltage when the combined input signals do not establish a current path between the drains of transistors 617 and 627 and the output terminals OUT and OUT*.

Figure 7:
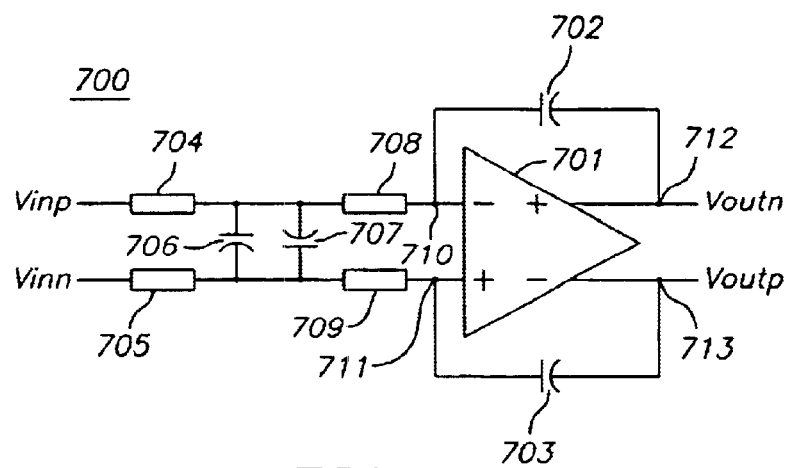
FIG. 7 illustrates a low pass filter according to one embodiment of the present invention.

FIG. 7 illustrates a low pass filter 700 according to one embodiment of the present invention. Low pass filter 700 may comprise a filter and an integrator. The filter comprises resistors 704 and 705 and capacitors 706 and 707. Input terminals of resistors 704 and 705 are coupled to receive differential inputs $V_{inp}$ and $V_{inn}$, respectively, and capacitors 706 and 707 are coupled between the other resistor terminals to create an RC filter. The integrator may include an operational amplifier 701, input resistors 708 and 709, and feedback capacitors 702 and 703. Input terminals of resistors 708 and 709 are also coupled to the output terminals of resistors 704 and 705 to receive the filtered signal. The opposite terminals of resistors 708 and 709 are coupled to the inputs of operational amplifier 701. Amplifier 701 generates differential outputs $V_{outn}$ and $V_{outp}$ on output terminals 712 and 713, respectively. Capacitors 702 and 703 are couple between output terminals $V_{outn}$ and $V_{outp}$ and input terminals 710 and 711. This amplifier configuration will integrate the output of the RC filter.

Figure 8:
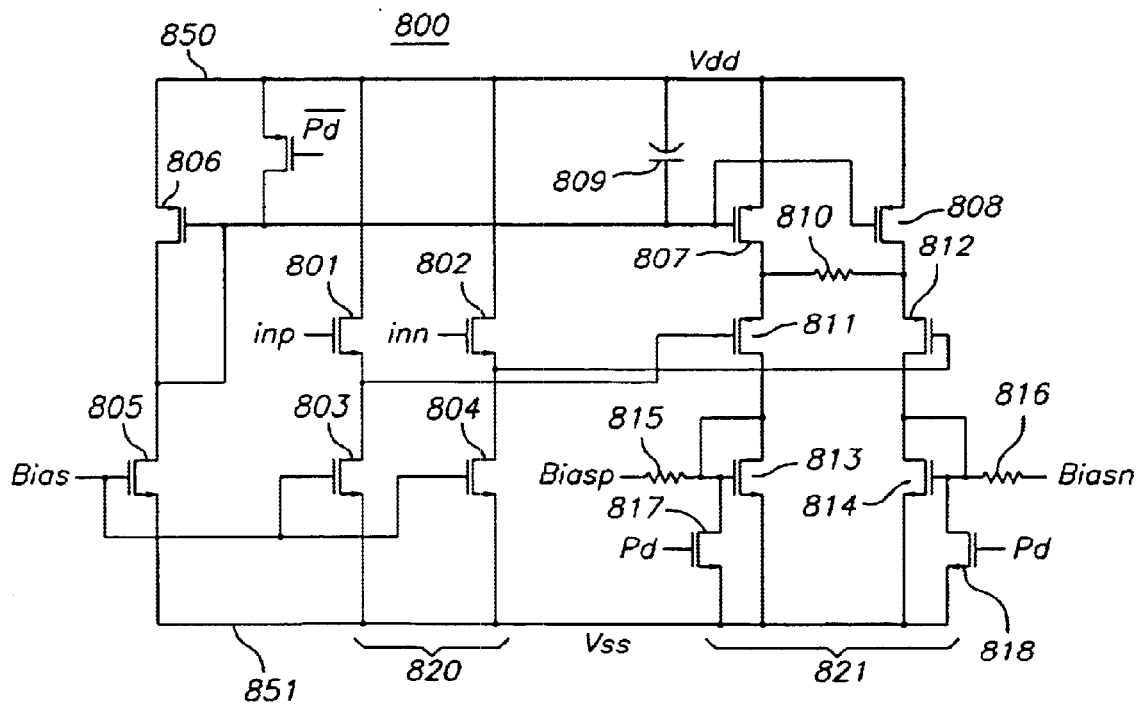
FIG. 8 illustrates a bias generator according to one embodiment of the present invention.

FIG. 8 illustrates a bias generator 800 according to one embodiment of the present invention. Bias generator 800 includes a level shift stage 820 and a bias output stage 821 for generating a bias output that may be used to control currents in other parts of the system. The inputs of bias generator 800 are "inp" and "inn," which are coupled to the outputs $V_{outn}$ and $V_{outp}$, respectively, of low pass filter 700 of FIG. 7. The inputs are received on the gates of level shift transistors 801 and 802. The sources of level shift transistors are coupled to current source transistors 803 and 804 and differential input transistors 811 and 812. A bias current network including transistors 803, 804, 805, 806, 807, and 808 generates currents for biasing the level shift input stage 820 and the bias output stage 821. The differential voltage received on transistors 801 and 802 will cause a differential shift in the drain currents of transistors 811 and 812, which also sets up a corresponding differential voltage across resistor 810. The differential current will change the bias voltage (i.e., Vgs) of transistors 813 and 814. The bias voltages of transistors 813 and 814 are provided on output terminals Biasp and Biasn through resistors 815 and 816, respectively, for controlling the bias, and consequently the time delay, of the delay elements in the system.

Figure 9:
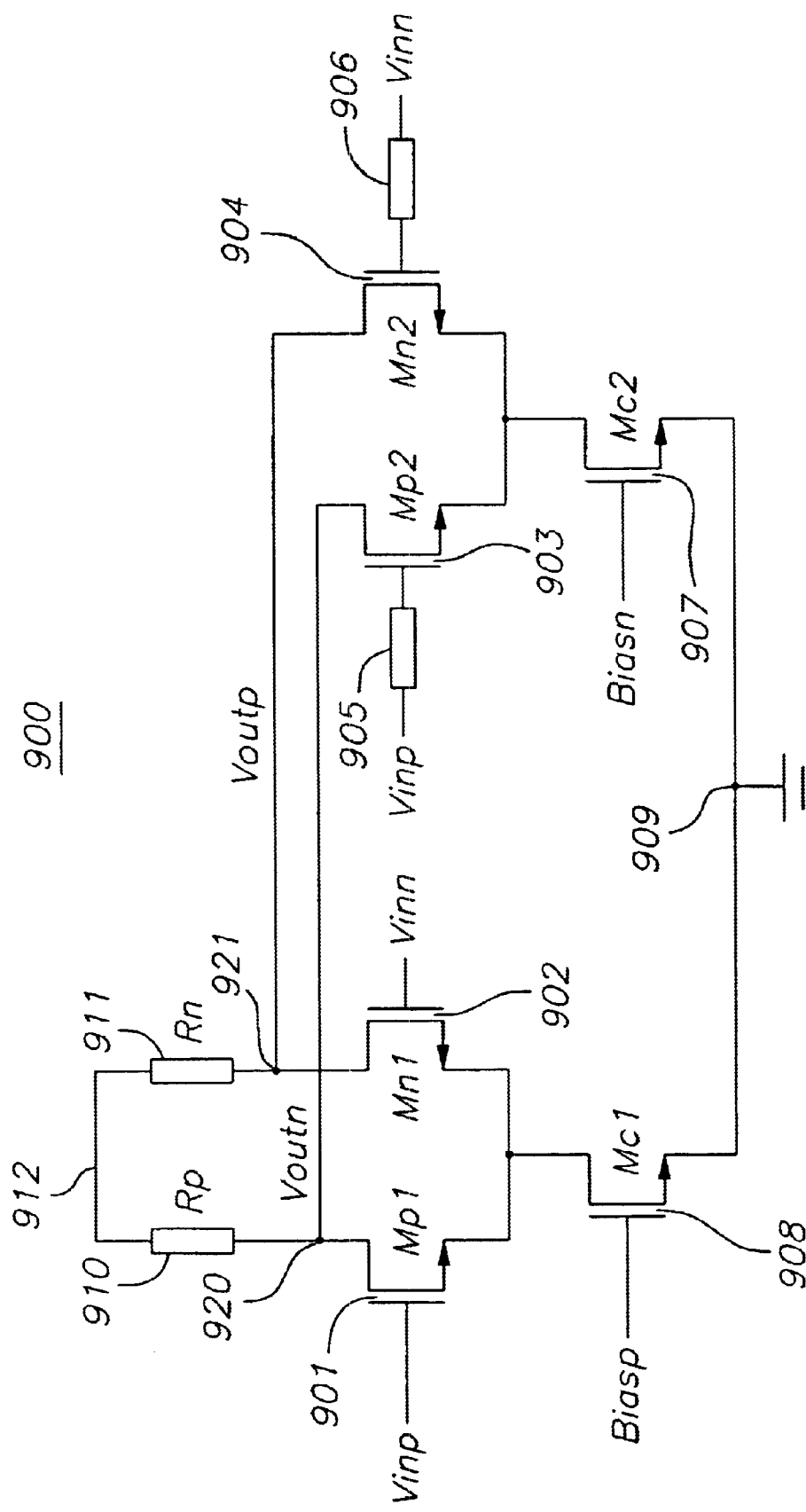
FIG. 9 illustrates a delay element according to one embodiment of the present invention.

FIG. 9 illustrates a delay element 900 according to one embodiment of the present invention. Delay element 900 includes a differential amplifier comprising NMOS input transistors 901 and 902 and NMOS bias transistors 908. The sources of the NMOS transistors 901 and 902 are coupled to output nodes 920 and 921. Load resistors 910 and 911 are coupled between the output nodes 920 and 921 and a supply voltage 912. The gates of transistors 901 and 902 receive a differential input signal to be delayed (e.g., a differential clock signal) and produce an output signal on nodes 920 and 921. The gate of transistor 908 is a bias control terminal for receiving an external bias control signal to control the bias current in transistors 901 and 902. A second differential amplifier is also coupled to load transistors 910 and 911. The second differential amplifier includes NMOS input transistors 903 and 904, input resistors 905 and 906, and NMOS bias transistor 907. The gates of transistors 903 and 904 receive the differential input signal to be delayed through resistors 905 and 906. Resistors 905 and 906 are connected in series with the gate terminals so that they create an RC delay with the gate capacitance of transistors 903 and 904. Additionally, the gate of transistor 907 is also a bias control terminal for receiving an external bias control signal to control the bias current in transistors 903 and 904. Signals received on transistors 901 and 902 will be received at output terminals 920 and 921 in a shorter time than the same signals received at transistors 903 and 904. Thus, the total time delay of delay element 900 can be adjusted by changing the bias current in transistors 907 and 908, which changes the contribution of each differential amplifier to the combined output of the delay element.

Having fully described several embodiments of the present invention, other equivalent or alternative methods of practicing the present invention will be apparent to those skilled in the art. For example, a variety of different numbers of delay elements may be used in the delay units disclosed above. Additionally, a variety of phase detectors could also be used depending on the application. These and other embodiments as well as alternatives and equivalents to the invention will be recognizable to those of skill in the art after reading the description of the present invention. The scope of the invention should not, therefore, be determined solely by reference to the above description, but instead should be determined with reference to the appended claims along with their full scope of equivalents and alternatives.

What is claimed is:

1. A delay circuit comprising:
   a delay locked loop coupled to receive a differential periodic input signal, the delay locked loop generating a first one or more delayed periodic signals and a control signal for controlling the time delay between the periodic input signal and the first one or more delayed periodic signals, the delay locked loop comprising logic circuit coupled to receive a plurality of differential input pair signals, wherein the logic circuit comprises a plurality of logic units to provide symmetric signal paths for each of the differential input pair signals through the logic units; and
   a controlled delay circuit for generating a second one or more delayed periodic signals, the controlled delay circuit coupled to receive at least one of the first one or more delayed periodic signals and having a delay control terminal coupled to the control signal for controlling the time delay between the at least one of the first one or more delayed periodic input signals and the second one or more delayed periodic signals.

2. The delay circuit of claim 1 wherein the controlled delay circuit comprises a plurality of series connected controlled delay elements each including a control terminal coupled to the control signal for controlling the time delay of each delay element.

3. The delay circuit of claim 1 wherein the delay locked loop comprises a second controlled delay circuit for generating the first one or more delayed periodic signals, the second controlled delay circuit having a second delay control terminal coupled to the control signal.

4. The delay circuit of claim 3 wherein the second controlled delay circuit comprises a plurality of series connected controlled delay elements each including a control terminal coupled to the control signal for controlling the time delay of each delay element.

5. The delay circuit of claim 4 wherein the plurality of delay elements comprises M delay elements each introducing a time delay approximately equal to T/4M, wherein T is period of the periodic input signal and M is an integer.

6. The delay circuit of claim 1 wherein the logic circuit comprises a phase comparator.

7. The delay circuit of claim 6 wherein the phase comparator is an XOR logic circuit.

8. The delay circuit of claim 6 wherein the delay locked loop further comprises a filter coupled to an output of the phase comparator and a bias generator coupled to an output of the filter, and wherein the control signal is a bias control signal.

9. The delay circuit of claim 8 wherein the bias control signal is provided to a plurality of delay elements in the delay locked loop and in the controlled delay circuit so that the time delay of each delay element is approximately the same.

10. The delay circuit of claim 1 wherein the periodic input signal comprises a clock signal, and in response thereto, the delay circuit generates a plurality of delayed clock signals.

11. The delay circuit of claim 1 further comprising a multiplexer, coupled to receive the first one or more delayed periodic signals and the second one or more delayed periodic signals, for selectively coupling one of the received periodic signals to a multiplexer output terminal in response to a multiplexer selection control signal.

12. An integrated circuit including a delay circuit comprising:
a delay locked loop including a first controlled delay circuit coupled to a logic circuit and a filter coupled to the logic circuit to provide a first control voltage, the first control voltage being coupled to a first control terminal of the first controlled delay circuit, wherein the logic circuit is coupled to receive a plurality of differential input pair signals, wherein the logic circuit comprises a plurality of logic units to provide symmetric signal paths for each of the differential input pair signals through the logic units; and
a second controlled delay circuit having an input coupled to an output of the first controlled delay circuit and a second control terminal coupled to the first control voltage of the filter.

13. The integrated circuit of claim 12 wherein the first controlled delay circuit comprises a plurality of series connected delay elements.

14. The integrated circuit of claim 12 wherein the second controlled delay circuit comprises one or more series connected delay elements.

15. The integrated circuit of claim 12 wherein the delay locked loop further comprises an XOR logic circuit.

16. The integrated circuit of claim 12 wherein the delay locked loop is coupled to receive a clock signal.

17. The integrated circuit of claim 12 further comprising a multiplexer having a plurality of inputs coupled to the first and second controlled delay circuits and a select input for selectively coupling a delayed signal to a multiplexer output terminal.

18. A delay circuit comprising:
a differential delay circuit input terminal;
a first plurality of series connected delay elements each including a control terminal for controlling the time delay of each delay element, the delay elements including a first delay element having a first input coupled to the delay circuit input terminal;
a second plurality of series connected delay elements having a first input coupled to an output of the first plurality of delay elements, each of the second plurality of delay elements including a control terminal for controlling the time delay of each delay element;
a phase comparator having a first differential input coupled to the delay circuit input terminal and a second differential input coupled to an output of a second delay element in the first plurality of delay elements, the phase comparator comprising a plurality of logic units coupled to the first differential input and the second differential input to provide symmetric signal paths for differential input signals from the first differential input and the second differential input through the logic units;
a filter having an input coupled to an output of the phase comparator and an output coupled to the control terminals of the first plurality of delay elements and the second plurality of delay elements; and
a plurality of delayed signal outputs at a corresponding plurality of output terminals of the first and second plurality of delay elements.

19. The delay circuit of claim 18 further comprising a clock signal coupled to the delay circuit input terminal, wherein the delay circuit produces a plurality of delayed clock signals on the delayed signal outputs.

20. The delay circuit of claim 18 further comprising a bias generator coupled to the output of the filter, the bias generator receiving a voltage control signal from the filter, and in response thereto, providing a bias output signal coupled to the control terminal of each of the plurality of delay elements.

21. The delay circuit of claim 20 wherein the bias generator provides a control voltage to each delay element so that the time delay of each delay element is approximately the same.

22. The delay circuit of claim 18 wherein the phase comparator is an XOR logic circuit.

23. The delay circuit of claim 22 wherein the first plurality of delay elements comprises M delay elements each introducing a time delay approximately equal to T/4M, wherein T is an input signal period and M is an integer.

24. The delay circuit of claim 18 further comprising a multiplexer for selectively coupling one of the delay circuit outputs to a multiplexer output terminal in response to a multiplexer selection control signal.

25. A delay circuit comprising:
a delay locked loop including a first plurality of series connected bias controlled delay elements each including a bias control terminal for controlling the time delay of each element, the delay locked loop further comprising:
an XOR logic circuit having a first differential input coupled to a differential delay circuit input terminal and a second differential input coupled to an output of the first plurality of delay elements, the XOR circuit comprising a plurality of logic units coupled to the first differential input and the second differential input to provide symmetric signal paths for differential input signals from the first differential input and the second differential input through the logic units; and
a bias generator coupled to an output of the XOR logic circuit, the bias generator providing a voltage output coupled to the bias control terminal of each of the first plurality of delay elements; and
a second plurality of series connected bias controlled delay elements having a first input coupled to the output of the first plurality of delay elements, each of the second plurality of delay elements including a bias control terminal coupled to the voltage output of the bias generator.

26. The delay circuit of claim 25 wherein the delay locked loop receives a clock signal and produces one or more delayed clock signals on one or more delay circuit outputs.

27. The delay circuit of claim 25 wherein the first plurality of delay elements comprises M delay elements each introducing a time delay approximatelY equal to T/4M, wherein T is an input signal period and M is an integer.

28. The delay circuit of claim 25 wherein the bias generator voltage output controls the bias current in each delay element so that the time delay of each delay element is approximately the same.

29. The delay circuit of claim 25 further comprising a multiplexer for selectively coupling an output of the first or second plurality of delay elements to a multiplexer output terminal in response to a multiplexer selection control signal.

* * * * *

UNITED STATES PATENT AND TRADEMARK OFFICE
CERTIFICATE OF CORRECTION

PATENT NO. : 6,870,415 B2
DATED : March 22, 2005
INVENTOR(S) : Zhang et al.

It is certified that error appears in the above-identified patent and that said Letters Patent is hereby corrected as shown below:

<u>Title page,</u>
Item [75], Inventors, Guangming Yin, delete "Foothill Range", insert
-- Foothill Ranch --.

<u>Column 10,</u>
Line 19, before "logic circuit", insert -- a --.

<u>Column 12,</u>
Line 55, delete "approximatelY", insert -- approximately --.

Signed and Sealed this

Eighth Day of November, 2005

JON W. DUDAS
*Director of the United States Patent and Trademark Office*

UNITED STATES PATENT AND TRADEMARK OFFICE
CERTIFICATE OF CORRECTION

PATENT NO. : 6,870,415 B2
DATED : March 22, 2005
INVENTOR(S) : Zhang et al.

It is certified that error appears in the above-identified patent and that said Letters Patent is hereby corrected as shown below:

Title page,
Item [56], References Cited, U.S. PATENT DOCUMENTS, insert
-- 6,348,826 B1 *    2/2002    Mooney et al.    327/270 --.

Signed and Sealed this

Seventeenth Day of January, 2006

JON W. DUDAS
*Director of the United States Patent and Trademark Office*